(12) United States Patent
Wang et al.

(10) Patent No.: US 11,658,199 B2
(45) Date of Patent: *May 23, 2023

(54) IMAGE SENSOR WITH THROUGH SILICON FIN TRANSFER GATE

(71) Applicant: OMNIVISION TECHNOLOGIES, INC., Santa Clara, CA (US)

(72) Inventors: Qin Wang, San Jose, CA (US); Gang Chen, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 230 days.

This patent is subject to a terminal disclaimer.

(21) Appl. No.: 16/998,815

(22) Filed: Aug. 20, 2020

(65) Prior Publication Data

US 2022/0059600 A1 Feb. 24, 2022

(51) Int. Cl.
*H01L 27/146* (2006.01)

(52) U.S. Cl.
CPC .. *H01L 27/14643* (2013.01); *H01L 27/14603* (2013.01); *H01L 27/14609* (2013.01)

(58) Field of Classification Search
CPC ......... H01L 27/14616; H01L 27/14612; H01L 27/14603
See application file for complete search history.

(56) References Cited

U.S. PATENT DOCUMENTS

| 7,749,831 | B2* | 7/2010 | Lyu | .......... H01L 27/14603 |
| | | | | 257/E21.189 |
| 9,443,900 | B2 | 9/2016 | Yamashita | |
| 10,566,361 | B2* | 2/2020 | Wei | .......... H01L 27/14643 |
| 2014/0252420 | A1 | 9/2014 | Yi et al. | |

* cited by examiner

*Primary Examiner* — David A Zarneke
(74) *Attorney, Agent, or Firm* — Christensen O'Connor Johnson Kindness PLLC

(57) ABSTRACT

A device includes a photodiode, a floating diffusion region, a transfer gate, and a channel region. The photodiode is disposed in a semiconductor material. The photodiode is coupled to generate charges in response to incident light. The photodiode has a substantially uniform doping profile throughout a depth of the photodiode in the semiconductor material. The floating diffusion region is disposed in the semiconductor material. The transfer gate is disposed between the photodiode and the floating diffusion region, wherein the transfer gate includes a plurality of fin structures. The channel region associated with the transfer gate is in the semiconductor material proximate to the transfer gate. The transfer gate is coupled to transfer the charge from the photodiode to the floating diffusion region through the channel region in response to a transfer signal coupled to be received by the transfer gate.

21 Claims, 7 Drawing Sheets

IMAGE SENSOR WITH THROUGH SILICON FIN TRANSFER GATE

BACKGROUND INFORMATION

Field of the Disclosure

This disclosure relates generally to image sensors, in particular to image sensors with pixels including transfer gates.

Background

Image sensors may be used in various devices including cameras, sensors, and consumer electronics. A typical image sensor operates as follows. Image light from an external scene is incident on the image sensor. The image sensor includes a plurality of photosensitive elements such that each photosensitive element absorbs a portion of incident image light. Photosensitive elements included in the image sensor, such as photodiodes, each generate image charge upon absorption of the image light. The amount of image charge generated is proportional to the intensity of the image light. The generated image charge may be used to produce an image representing the external scene. Image sensors may include pixels with transfer gates controlling when a charge in a photodiode is transmitted.

With the ever-decreasing sizes of image sensors and the individual imaging pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes. The quality of an electronic image can be improved, for example, by reducing image lag. Image lag can be caused by charge(s) in a photodiode region of a pixel that has not been removed from exposure to a previous image captured degrading image quality. Accordingly, there is a need to reduce the image lag in photodiodes to improve the image quality of sensing arrays.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
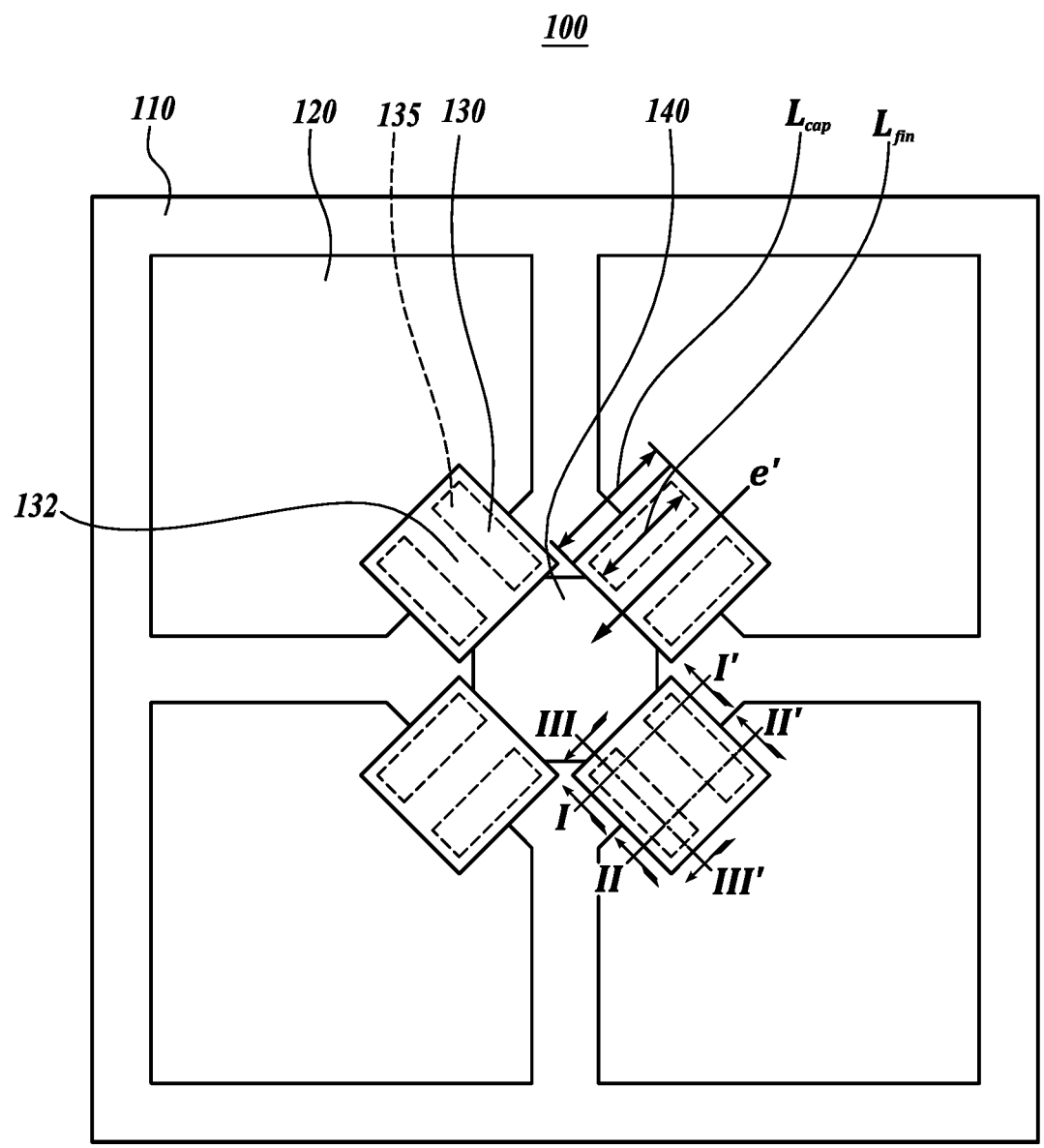
FIG. 1 illustrates a top view of an example device in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to image sensors and devices, and methods for fabricating image sensors are disclosed herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The term semiconductor material may refer to semiconductors such as silicon, silicon-germanium, germanium, gallium arsenide, and combinations thereof, used to form a semiconductor substrate. The term semiconductor substrate may refer to a substrate, formed of one or more semiconductors, subjected to previous process steps that form regions and/or junctions in the semiconductor material of the semiconductor substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Image sensors may include many individual pixels formed in semiconductor material of semiconductor substrate, each pixel may include a photodiode. Each photodiode photogenerates one or more charges when incident light enters the photodiode during an integration period or an exposure time. The charge is transferred through a channel region to a drain diffusion region. The drain may be a floating drain, commonly referred to as floating diffusion region. The channel region allows the charge(s) to transfer though to the floating diffusion based on a voltage of a transfer gate. The voltage of the transfer gate is controlled by a controller. The shape and location of the transfer gate as well as the doping profile of the components affect the speed and resistance with which the channel region can pass the charge from the photodiode to the floating diffusion region. The charges transferred to the floating diffusion region is subsequently readout by the controller.

As will be discussed, example image sensors and pixels disclosed herein have an architecture that improves performance of the pixels with regards to speed and accuracy of reading out the charges generated by the photodiodes. In one example, the transfer gate includes fin-like structures which formed along a channel width direction of the transfer gate increasing an effective channel width of a channel region associated with the respective transfer gate formed between the photodiode and the floating diffusion region. This provides high transfer current allowing high speed travel of charges directly from the photodiode to the floating diffusion region. Further, in one embodiment, the fin-like structure extended through the entire photodiode in the semiconductor material allowing the photodiode to include a photodiode region having a substantially uniform doping profile throughout the depth of the photodiode instead of gradient profile, which can reduce the potential level of pinning voltage Vpin (the potential voltage of photodiode when reset e.g., fully empty) removing deep energy traps within photodiode region that result in incomplete charge transfer, without affecting the full well capacity (FWC) of the photodiode. As such, the image lag issue can be improve, thereby increase image sensor performance.

FIG. 1 illustrates a top view of an example device 100 in accordance with the teachings of the present invention. In embodiment, device 100 may be an image sensor, for example a CMOS image sensor device. In embodiments, device 100 may be part of image sensor, for example a pixel cell. The device 100 may be formed in a semiconductor material (such as silicon) and may include an isolation layer 110, photodiodes 120, transfer gates 130, and floating diffusion region 140. The semiconductor material is used to form a semiconductor substrate or wafer. FIG. 1 illustrates a four-shared pixel layout, in which four photodiodes in a pixel cell are coupled to a floating diffusion region 140 through respective transfer gates 130 and each transfer photogenerated charges to the floating diffusion region 140 through respective transfer gate 130. It is appreciated that the described invention can be apply to pixel cell with one photodiode (single pixel cell), as well as other shared pixel layout including two-shared pixel layout, six-shared pixel layout or eight six-shared pixel layout.

The isolation layer 110 may surround each of the photodiodes 120 and electrically isolate the photodiodes 120 from adjacent photodiodes and other components (e.g., pixel transistors) of the device 100. The isolation layer 110 may be formed from an implant isolation well having a conductive type opposite to the conductive type of photodiodes, and same conductive type as semiconductor material. In embodiments, the portion of the isolation layer 110 surrounding the photodiodes 120 may be formed by deep trench isolation or P type doped implantation. The isolation layer 110, as described in further detail below, may include portions formed above and/or below the photodiodes 120.

The photodiodes 120 include a photodiode region formed of an N-type doped region in the semiconductor material (e.g., a P-type doped semiconductor material). The photodiode region of each photodiode 120 may be formed by ion implantation of N type dopants e.g., phosphorus, arsenic with same dosage and number of implant energy for different implant depth to form photodiode 120 having uniform doping profile in the semiconductor material. The photodiodes 120 having a conductive type opposite the conductive type of semiconductor material. The photodiodes 120 may be arranged in the semiconductor material in such a way that incident light causes the photodiodes 120 to photogenerate and accumulate one or more charges, for example by light absorption in the photodiode region.

In some embodiments, each of photodiode 120 is in a form of a pinned photodiode. For example, each of photodiode 120 is a p-n-p pinned photodiode, constructed using a p-type semiconductor material, an n-type doped region implanted into the p-type semiconductor material, and a pinning layer (e.g., heavily P-type doped) implanted into semiconductor material between surface of semiconductor material and the n-type doped region. This pinning layer acts as the "pin" in a p-n-p photodiode.

The transfer gates 130 may include a planar gate disposed on a first surface (e.g., front surface) of semiconductor material surface and through semiconductor vertical gates disposed in the semiconductor material. Each of the transfer gates 130 may be formed of conductive material such as polysilicon material, metal material or other material suitable for forming a gate electrode. In the illustrated embodiment, each of the transfer gates 130 may include a cap portion 132 (planar gate portion) and fin structures or through semiconductor fin structures (vertical gate portions) 135. In the example embodiment shown in FIG. 1, each of the transfer gates 130 include cap portion 132 and two through semiconductor fin structures 135. The cap portion 132 is formed on the first surface (e.g., front surface) of semiconductor material surface of the semiconductor material. Each of fin structures 135 is extended from the cap portion 132 a depth into the semiconductor material toward a second surface opposite to the first surface. In some embodiments, the depth of each fin structures extend into the semiconductor material is greater or deeper than the implanted photodiode region of respective photodiode 120 but less than a thickness (e.g., 2 μm-6 μm) of the semiconductor material. In embodiments, each fin structures may be formed to extend from the first surface and complete through the semiconductor material. The cap portion 132 is electrically connected to the fin structures 135 of transfer gate 130, and the fin structures 135 are electrically connected in parallel. The fin structures 135 of the transfer gate 130 further laterally extends (in a channel length direction) from a respective photodiode 120 to the floating diffusion region 140, i.e., extend along a channel direction of respective transfer gate 130. In embodiments, the length $L_{fin}$ (along channel direction of transfer gate 130) of each fin structure 135 is less than the length $L_c$ (along channel direction of transfer gate 130) of cap portion 132. It is appreciated that the transfer gates 130 may include any number of fin structures 135. The fin structures 135 extend from one of the photodiodes 120 to the floating diffusion region 140. The cap portion 132 connects the fin structures 135 in the transfer gate 130.

It is appropriated by those skilled in the art that the channel length direction of transfer gate 130 refers to a direction where photogenerated charges flows e.g., along direction from photodiode 120 to floating diffusion region 140 (direction of e⁻), the channel width direction of transfer gate 130 refers to a direction lateral across transfer gate e.g., along direction across the photodiode region of photodiode 120.

The floating diffusion region 140 may be formed of a doped region having same conductive type as the photodiode region of the photodiodes 120, e.g., an N-type doped region in the semiconductor material. The floating diffusion region 140 may be formed by ion implantation of N type dopants e.g., phosphorus, arsenic. The floating diffusion region 140 may be connected to multiple transfer gates 130 (in this example embodiment four), thus may be referred as a shared floating diffusion region. The floating diffusion region 140 may be a floating drain. The floating diffusion region 140 may collect charges from multiple photodiodes 120 via the transfer gates 130 during a charge transfer operation of device 100.

In operation, image charge is accumulated in respective photodiode region of photodiodes 120 in response to light that is incident upon the photodiodes 120, for example through the second surface (e.g., backside surface) of the semiconductor material. Each of transfer gates 130 operate to transfer the image charges that is accumulated in each respective photodiode 120 to the floating diffusion region 140 in response to transfer signal for subsequent signal read out.

In an alternative embodiment, the isolation layer 110 may be formed of an N-type doped region and the photodiodes 120 and floating diffusion region 140 may be formed of P-type doped region in an N-type doped semiconductor material.

Figure 2:
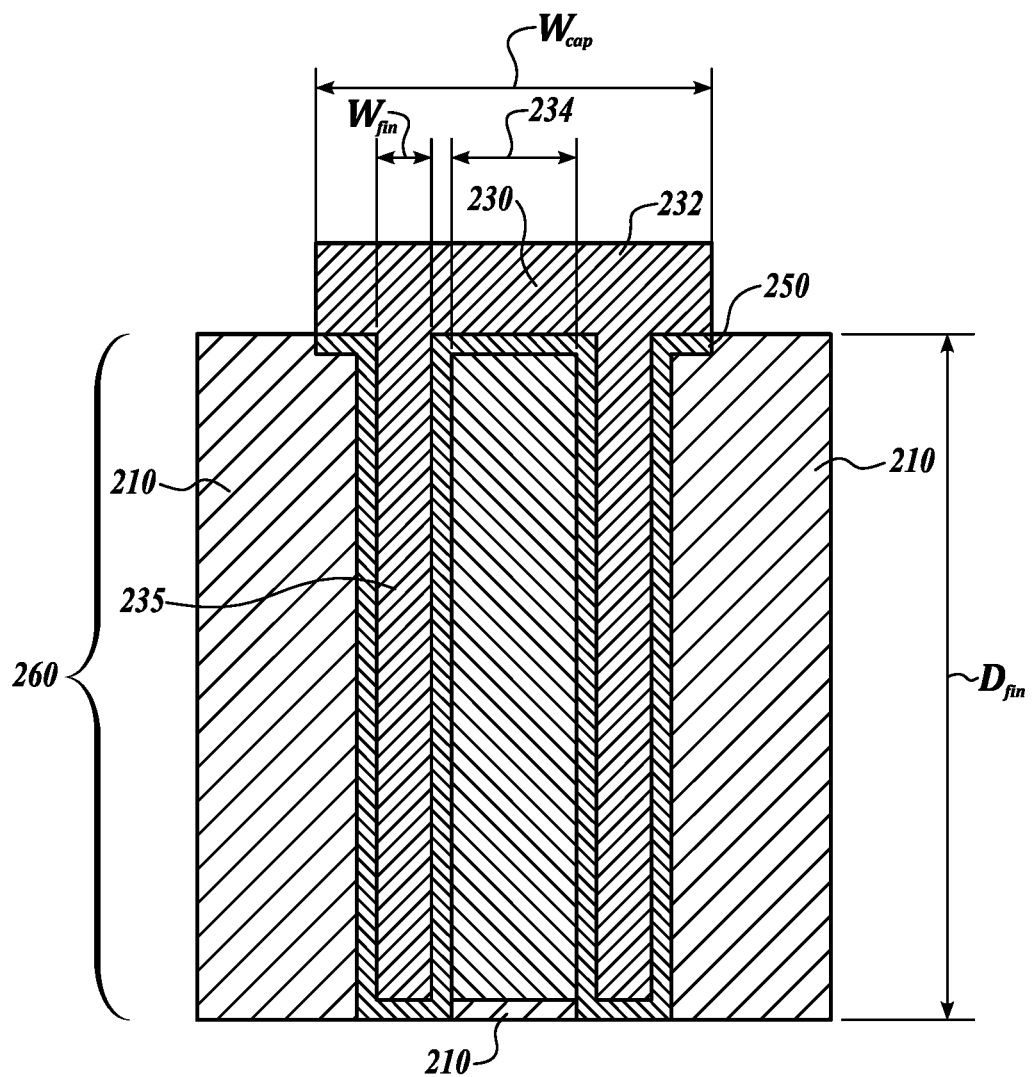
FIG. 2 illustrates an example cross section view of the device in accordance with the teachings of the present invention.

FIG. 2 illustrates an example cross section view of the device 100 in accordance with the teachings of the present invention. FIG. 2 illustrates an example cross-section along the line I-I' in FIG. 1. The cross-sectional view shown in FIG. 2 illustrates semiconductor material 260 in which the other regions can be formed through doping or etching and deposition. The semiconductor material 260 includes an isolation layer 210, transfer gate 230, and gate oxide layer 250. The isolation layer 210 may be part of isolation layer 110 and provides electrically and/or optical isolation between adjacent photodiodes 120. The isolation layer 210 is disposed on either side of through semiconductor fin structures and underneath the transfer gate 230. In embodiment, the transfer gate 230 may be the transfer gate 130, and each of the through semiconductor fin structures 235 is part of through semiconductor fin structures 135.

The transfer gate 230 includes a cap portion 232 (planar gate portion of transfer gate 230) disposed proximate to the semiconductor material 260, and through semiconductor fin structures 235 (vertical gate portion of transfer gate 230). Each through semiconductor fin structure 235 extends from the cap portion 232 into and through the semiconductor material 260.

The gate oxide layer 250 is disposed on the semiconductor material 260 and between the transfer gate 230 and the semiconductor material 260. The gate oxide layer 250 may be formed by thermal oxidation or oxide deposition. In one embodiment, the gate oxide layer 250 may be grown on a surface (e.g., front surface) of semiconductor material prior to the formation of transfer gate 230 with appropriate thickness by thermal oxidation process. In one embodiment, the thickness of the gate oxide layer 250 may range between 30 Å-100 Å. The gate oxide layer 250 is juxtaposed next to the underside of the cap portion 232, and juxtaposed next to the through semiconductor fin structures 235. The gate oxide layer 250 may be formed of an oxide such as silicon dioxide.

Each through semiconductor fin structures 235 has a length $L_{fin}$ formed along a channel width direction of transfer gate 230 (along the arrow designated e⁻) to increase the effective channel width associated with transfer gate 230. In one example, two vertical trenches are formed in semiconductor material 260, and the vertical trenches extended from semiconductor material surface (e.g., front surface) of the semiconductor material 260. Gate oxide layer 250 is formed, for example deposited in or grown inside the vertical trenches and conformally to the sidewalls of vertical trenches. Through semiconductor fin structures 235 are disposed into vertical trenches. In embodiments, the fin structures 235 are formed in parallel to each other. The spacing 234 between through semiconductor fin structures 235 may range between 0.05 μm-0.5 μm.

The transfer gate 230 is electrically isolated by the gate oxide layer 250 such that charge accumulated on the transfer gate 230 does not flow to the rest of the device 100 and likewise charge in the rest of the device 100 does not flow to the transfer gate 230.

In one embodiment, a passivation layer may be disposed proximate and surround each through semiconductor fin structure 235 and underneath the through semiconductor fin structures 235 in the semiconductor material 260. In embodiments, the semiconductor material region between through semiconductor fin structures 235 may include a lightly-doped region of same conductive type as photodiode 120 to provide a blooming path for excess charge to flow from photodiode 120 to floating diffusion region 140 to prevent respective photodiode 120 from saturation, for example during integration of device 100. In embodiments, the extended depth of each of through semiconductor fin structures 235 is through the photodiode region (e.g., n-type doped region) of the respective photodiode 120 to build up electrical field in the semiconductor material upon receiving the biasing voltage (e.g., transfer signal) facilitating charge transfer between the respective photodiode 120 and floating diffusion region 140 in both surface region and deep in semiconductor material, shorten transfer path and improve image lag.

It is appreciated that the effective channel width associated with transfer gate 230 is the combination of the width $W_{cap}$ of cap portion 232 and the perimeter of through semiconductor fin structures 235 (e.g., the width $W_{fin}$ of the bottom portion of each through semiconductor fin structure 235 and the side length $D_{fin}$ of each through semiconductor fin structure 235). In some embodiments, the depth that each of through semiconductor in structure 235 extended into semiconductor material 260 is substantially the same. In some embodiments, the depth that each of fin structure 235 extended into semiconductor material 260 can be different, for example one fin structure may be shorter than the other. In some embodiments, the width of the fin structure 235 (e.g., the length of the fin structure 235 along the width of cap portion 232) is constant throughout the depth. Restated, the width of the fin structure 235 is the same from top to bottom of the fin structure 235.

When a bias voltage is applied to the transfer gate 230 is increased e.g., greater than the threshold voltage of the transfer gate 230, a channel region may be formed between the photodiode 120 and floating diffusion region 140. The channel region may be formed in the semiconductor material region in proximate to the transfer gate 230, e.g., a planar channel region form underneath the cap portion 232 of transfer gate 230 coupled to vertical channel region formed along each vertical oriented through semiconductor fin structure 235 allowing passage of charges from the photodiode 120 to the floating diffusion region 140. Transfer gate 230 upon received the bias voltage generates high conduction current facilitating photogenerated charge transfer. A large portion (a majority) of the photogenerated charges will pass through the channel region formed between the through semiconductor fin structures 235, to the floating diffusion region 140, however, a portion of the charge will also pass through the isolation layer 210 along the outsides of the through semiconductor fin structures 235.

As will be explained in greater detail below, the voltage applied to the transfer gate 230 is controlled by a controller. For example, a transfer signal from the controller may change or tune the voltage received at the transfer gate 230. The transfer gate 230 is coupled form a planar channel underneath the cap portion 232 and through semiconductor fin structure 235, and a vertical channel around the through semiconductor fin structure 235 and between fin structures 235 to transfer the charge from the photodiode 120 to the floating diffusion region 140 through the channel in response to the transfer signal received by the transfer gate 230.

Figure 3:
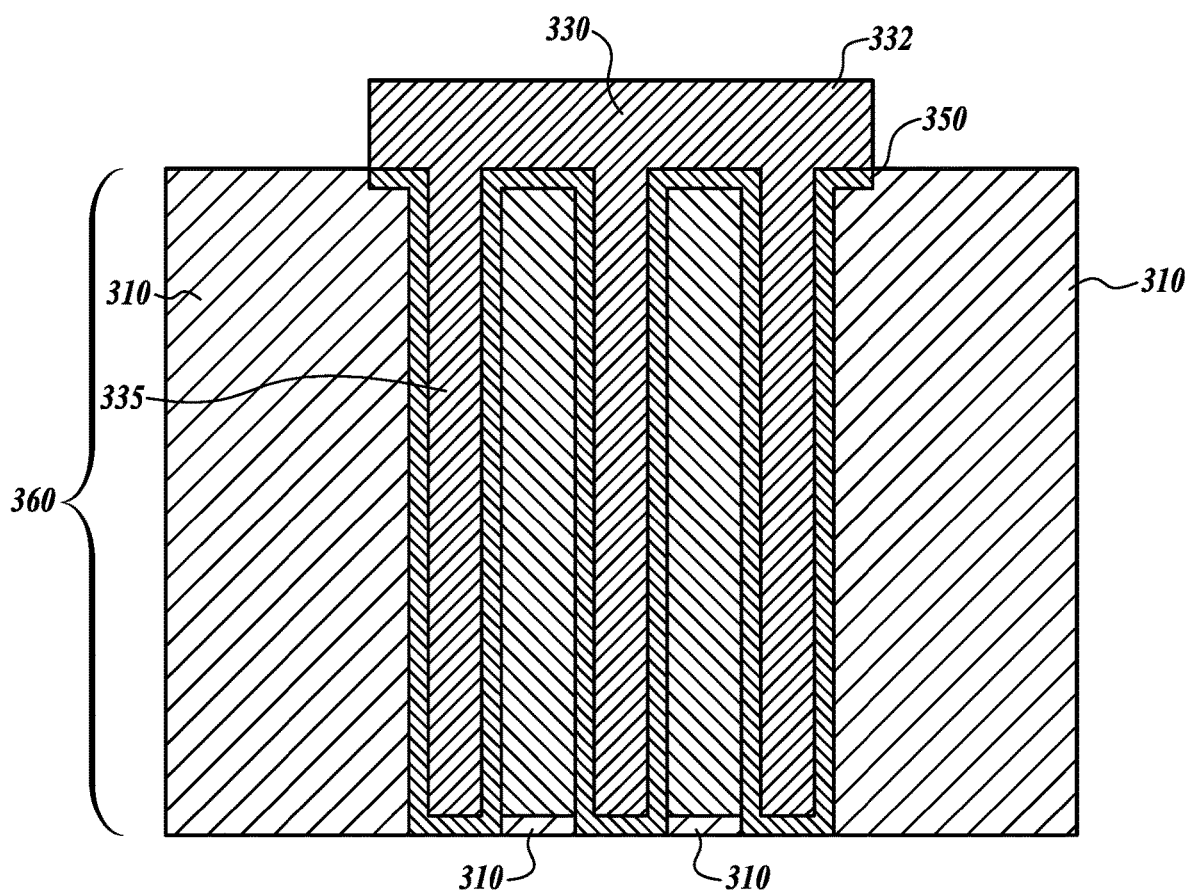
FIG. 3 illustrates another example cross section view of the device in accordance with the teachings of the present invention.

FIG. 3 illustrates an alternative example cross section view of the device 100 in accordance with the teachings of the present invention. FIG. 3 may illustrate an example cross-section along the line I-I' in an embodiment similar to FIG. 1 but with three fin structures 135 that is extended through the semiconductor material 360 to further increase effective channel width associated with transfer gate 130. The cross-sectional view shown in FIG. 3 illustrates a semiconductor material 360 including an isolation layer 310, a transfer gate 330 structure, gate oxide layer 350. The isolation layer 310 may be part of isolation layer 110 and provides electrically and/or optical isolation between adjacent photodiodes 120. The isolation layer 310 is disposed on either side of through semiconductor material 360 and underneath the transfer gate 330.

The transfer gate 330 includes a cap portion (planar gate portion) 332 disposed proximate to the semiconductor material 360 and three through semiconductor fin structures (vertical gate portions) 335 with appropriate spacing in between. Each through semiconductor fin structure 335 extend from the cap portion 332 into and through the semiconductor material 360. Each of fin structures 335 is separated from adjacent through semiconductor fin structures 335 by semiconductor material 360. By having each through semiconductor through semiconductor fin structure 335 extended into the semiconductor material 360 and into the photodiode region of respective photodiode 120 in semiconductor material depth direction can shorten the transfer path between photodiode 120 and floating diffusion region 140, provide better leakage control. In embodiment, the transfer gate 330 may be the transfer gate 130, and each of the through semiconductor fin structures 335 is part of through semiconductor fin structures 135.

In some embodiments, each of through semiconductor fin structures 335 extended into semiconductor material 360 with substantially same depth. In some embodiments, each of through semiconductor fin structures 335 extended into semiconductor material 360 with different depth. As each of through semiconductor fin structures 335 is extended into the photodiode region of respective photodiode 120 allowing respective photodiode 120 to be configured with uniform doping profile through the semiconductor material 360 lower pinning voltage Vpin of respective photodiode 120 further improve charge transfer efficiency.

The semiconductor material 360, the isolation layer 310, transfer gate 330, and gate oxide layer 350 may have the material properties as the semiconductor material 260, the isolation layer 210, transfer gate 230, and gate oxide layer 250 and be similarly situated except that the transfer gate 330 includes three fin structures 335 instead of two. The inclusion of additional through semiconductor fin structures 335 may decrease resistance for the charge to flow from the photodiode 120 to the floating diffusion region 140 through the channel region. However, additional fin structures may take up more space. Any number off through semiconductor in structures 335 may be used with appropriate spacing in between.

Figure 4:
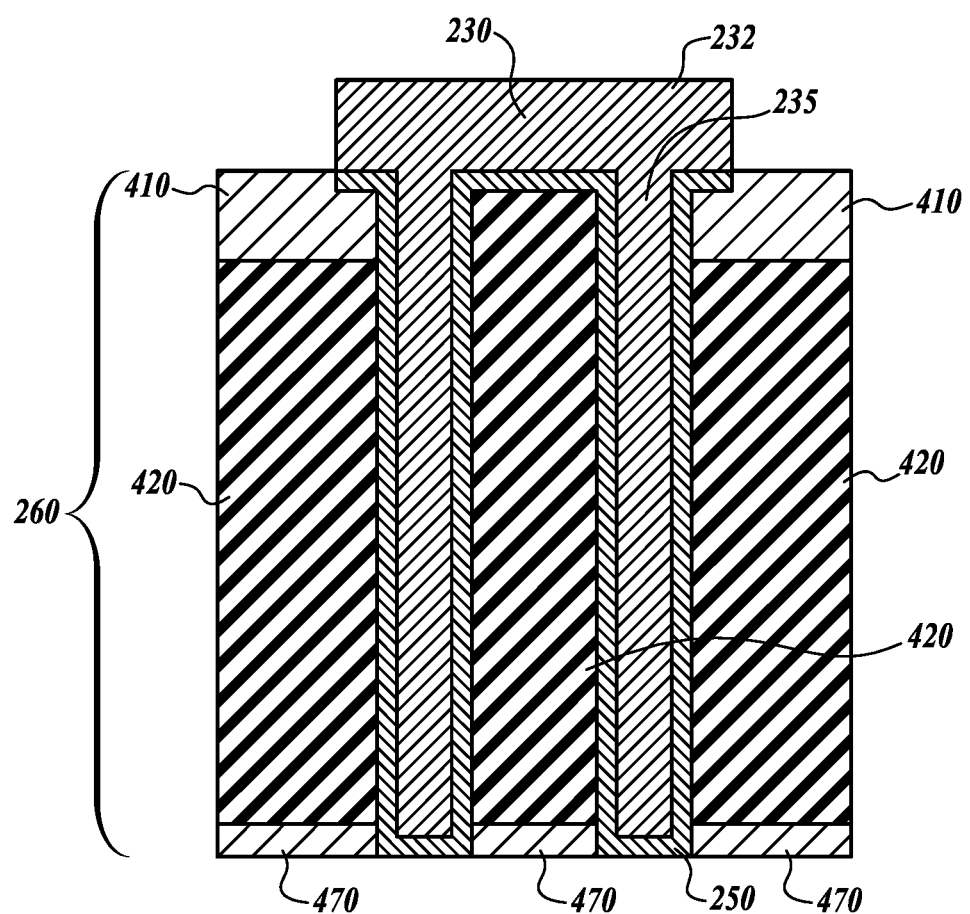
FIG. 4 illustrates yet another example cross section view of the device in accordance with the teachings of the present invention.

FIG. 4 illustrates an example cross section view of the device 100 in accordance with the teachings of the present invention. FIG. 4 illustrates an example cross-section along the line II-II' in FIG. 1. The cross-sectional view shown in FIG. 4 illustrates a semiconductor material 260, a pinning layer 410, a photodiode region 420 of a photodiode 120, a transfer gate 230, gate oxide layer 250, and an isolation layer 470. In embodiments, the transfer gate 230 may be the transfer gate 130, wherein each of the through semiconductor fin structures 235 is part of through semiconductor fin structures 135 and includes a section extended into the photodiode region 420 of respective photodiode 120.

The pinning layer 410 is disposed in the semiconductor material 260 proximate to a front surface of the semiconductor material 260. The pinning layer 410 is formed between the front surface of the semiconductor material 260 and photodiode region 420. The pinning layer 410 function to provide surface passivation to reduce dark current and white pixel. In embodiments, the pinning layer 410 is electrically coupled to isolation layer 110 of FIG. 1. In embodiments, the pinning layer 410 is grounded. The isolation layer 470 in the cross section of FIG. 4 is disposed below the photodiode region 420 of the photodiode 120 and floating diffusion region 140 (not shown in FIG. 4). The isolation layer 470 may be part of isolation layer 110 of FIG. 1 and is grounded. In embodiment, the isolation layer 470 may further include a portion implanted underneath transfer gate 230 and surrounding the through semiconductor fin structure 235.

The transfer gate 230 includes a cap portion 232 and a plurality of through semiconductor fin structures 235 extended from the cap portion 232 into and through the semiconductor material 260 and photodiode region 420, wherein portion of the through semiconductor fin structures 235 extend into the semiconductor material and portion of the through semiconductor fin structures 235 extend into the photodiode region 420. See FIG. 2 for illustration of through semiconductor fin structures 235 for the portion of the fin structures 235 that extends in the semiconductor material 260. The transfer gate 230 is electrically isolated by the gate oxide layer 250. The through semiconductor fin structures 235 of the transfer gate 230 extend into and through the photodiode region 420 of the photodiode 120. As such, the vertical channel region formed by the through semiconductor fin structures 235 upon receiving a biasing voltage extend into and through the photodiode region 420 of photodiode 120. In other words, a portion of channel region is formed within the photodiode region 420 of photodiode 120 facilitating charge transfer by providing large transfer current and laterally transfer path between the photodiode region 420 of photodiode 120 and floating diffusion region 140 within the semiconductor material 260. The extension of the fin structures 235 into the photodiode region 420 provides an advantage by shortening charge transfer path and reducing the time to transfer the charge from the photodiode region 420 of photodiode 120 to the floating diffusion region 140. In addition, the photodiode region 420 of photodiode 120 can be implanted and formed with evenly distribute dopant dosage semiconductor material 260 lowering pinning voltage Vpin of photodiode 120, thereby eliminating deep energy trap that traps photogenerated charges and further improve image lag issue.

Accordingly, little charge will travel along the base of the cap portion 232. The great majority of the charges will travel in the channel region formed by the fin structures e.g., channel region proximate to the sides of the through semiconductor fin structures 235 and not along the cap portion 232. The fin structures 235 extend into the semiconductor material 260 to a depth deeper than the photodiode region 420 of the photodiode 120 coupled thereto. This provides high transfer current and allows the charge to enter the channel region at any depth of the photodiode region 420 reducing the distance the charge has to travel within the photodiode region 420 before reaching the channel region. This reduces the delay and resistance to movement of the charge.

Optionally, in one embodiment, a passivation layer may be disposed proximate and surround each through semiconductor fin structure 235 and underneath the through semiconductor fin structures 235 in the semiconductor material 260. The passivation layer may be connected to the isolation layer 470 and the pinning layer 410. The passivation layer may be electrically coupled to the isolation layer 470 and the pinning layer 410 and be grounded.

The semiconductor material 260, the isolation layer 470, transfer gate 230, and gate oxide layer 250 may have the material properties as the semiconductor material 260, the isolation layer 210, transfer gate 230, and gate oxide layer 250 and be similarly situated.

Figure 5:
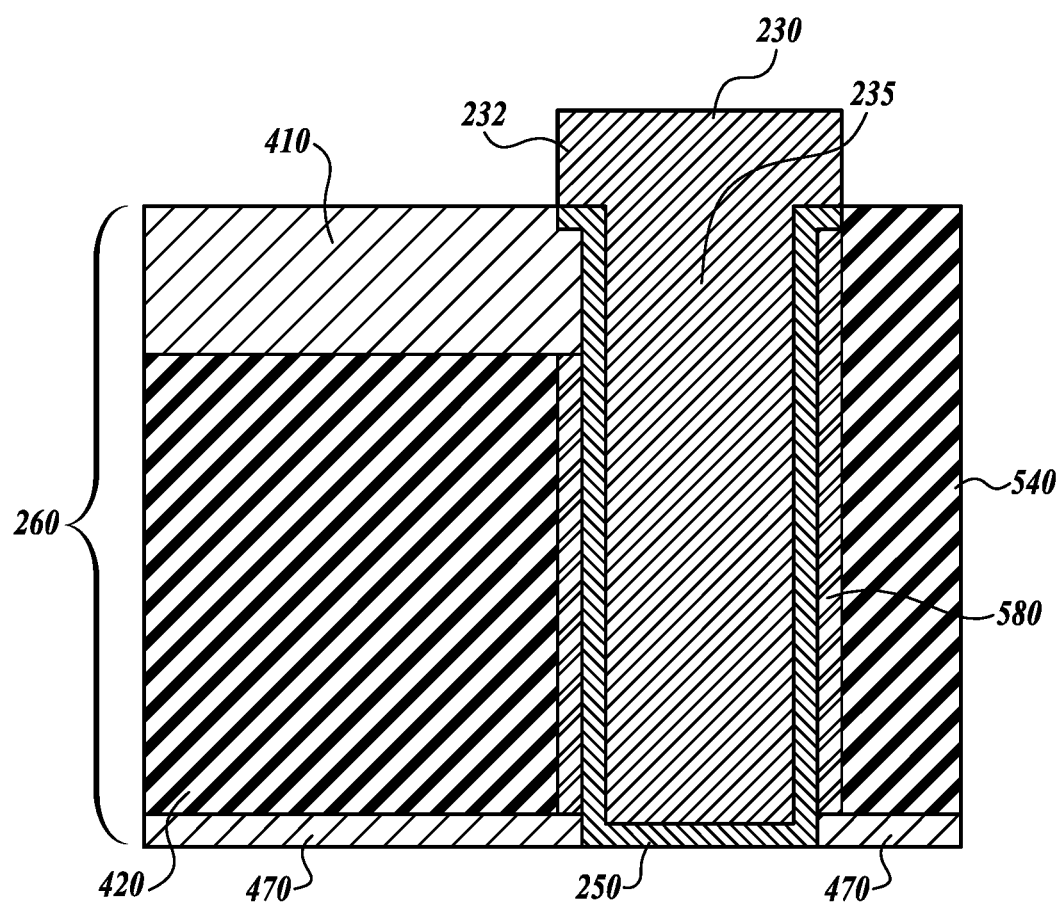
FIG. 5 illustrates still another example cross section view of the device in accordance with the teachings of the present invention.

FIG. 5 illustrates an example cross section view of the device 100 in accordance with the teachings of the present invention. FIG. 5 illustrates an example cross-section along the line in FIG. 1, i.e., along a channel direction of transfer gate 230. The cross-sectional view shown in FIG. 5 illustrates a semiconductor material 260 include a pinning layer 410, a photodiode region 420 of photodiode 120, transfer gate 230, floating diffusion region 540, gate oxide layer 250, and isolation layer 470. The transfer gate 230 includes a cap portion (planar gate portion) 232 and through semiconductor fin structures (vertical gate portion) 235 extended from the cap portion 223 into and through semiconductor material 260. The pinning layer 410 is disposed in the semiconductor material proximate to a front surface of the semiconductor material 260. The transfer gate 230 is electrically isolated by the gate oxide layer 250. In embodiments, the isolation layer 470 is formed underneath the photodiode region 420 of the photodiode 120 and floating diffusion region 540 and proximate to a backside surface of semiconductor material 260. In embodiments, the pinning layer 410 is electrically connected to the isolation layer 470.

Floating diffusion region 540 may be the floating diffusion region 140 or part of the floating diffusion region 140. The floating diffusion region 540 extends to about the same depth in the semiconductor material 260 as the photodiode region 420 of photodiode 120 and the through semiconductor fin structures 235. In embodiments, the junction depth of the floating diffusion region 540 with respect to a semiconductor material surface (e.g., front surface) of semiconductor material is configured to be less than or equal to the implant depth of photodiode region 420 of photodiode 120, and can be configured based on a specific pixel performance requirement e.g., conversion gain, blooming characteristic. Accordingly, photogenerated charges may pass laterally from the photodiode 420 directly along the fin structures 235 in the channel region formed throughout the semiconductor material to the floating diffusion region 540. This lateral path (e.g., horizontal path in FIG. 5) allows for the shortest channel path for the charge in the photodiode. This also allows for the entire photodiode region 420 depth to be utilized efficiently for transferring photogenerated charges with high transfer current. It is advantageous for the photodiode region 420 of the photodiode 120 to have an even doping or uniform doping profile throughout the depth of the photodiode 420 in the semiconductor material 260. The transfer gate 230 is coupled to transfer the charge from the photodiode region 420 to the floating diffusion region 540 through the channel region in response to a transfer signal coupled to be received by the transfer gate 230.

In embodiments, each of the through semiconductor fin structure 235 may contact the floating diffusion region 540. In some embodiments the through semiconductor fin structure 235 may be arranged to laterally extend into the floating diffusion region 540. This provides an advantage in reducing the resistance and time for the charge to be transferred to the floating diffusion region 540.

In one embodiment, to reduce dark current, a passivation layer 580 may be disposed proximate and surround each through semiconductor fin structure 235 in the semiconductor material 260. The passivation layer 580 may be disposed between each through semiconductor fin structure 235 and photodiode region 420 of the photodiode 120, and between each through semiconductor fin structure 235 and floating diffusion region 540 providing passivation on sidewalls of through semiconductor fin structures 235. The passivation layer 580 may be connected to the isolation layer 470 and the pinning layer 410. The passivation layer 580 may be electrically coupled to the isolation layer 470 and the pinning layer 410 and be grounded.

Figure 6:
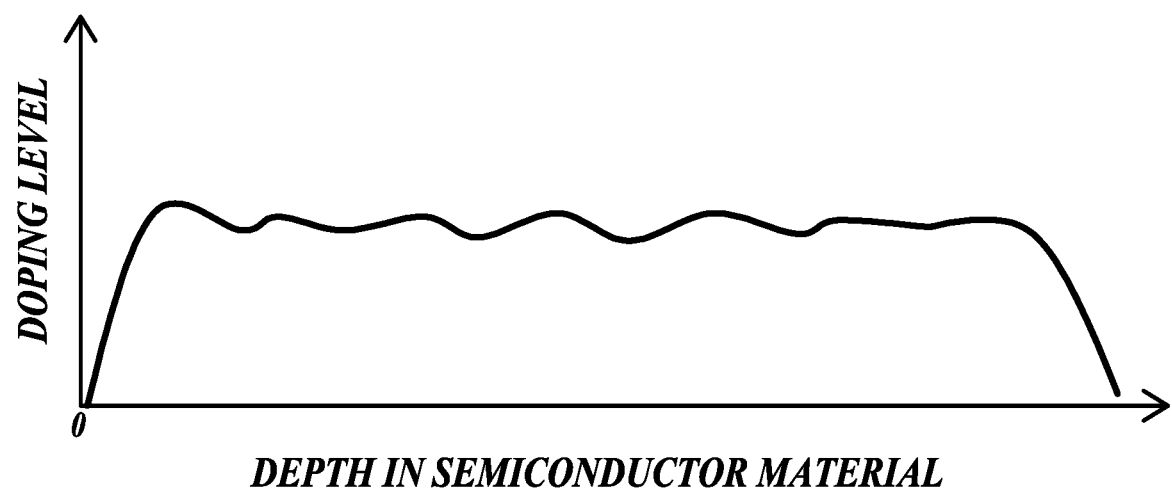
FIG. 6 illustrates a graph of an example doping of the photodiode of the device in accordance with the teachings of the present invention.

FIG. 6 illustrates a graph of an example doping of the photodiode of the device in accordance with the teachings of the present invention. As illustrated, the photodiode region 420 of photodiode 120 may have a consistent or uniform doping throughout the depth of the photodiode 420 in the semiconductor material (e.g., silicon) with a steep drop-off in the doping as the semiconductor material transitions from the photodiode region 420 of photodiode 120 into the isolation layer 470. Not including the transition regions at the top and bottom depth, the doping concentration is substantially uniform. Substantially uniform doping means that the doping concentration across the photodiode region 420 in laterally and depth-wise directions does not vary from an average doping concentration by no more than 50%, 40%, 30%, 20%, 10%, or 5%. In one embodiment the doping concentration variation across the photodiode region 420 does not exceed 10%. Restated, the majority of the depth between the top and bottom transitions has a generally uniform doping concentration.

In typical pixel design with charge transfer near semiconductor material surface, for example with planar transfer gate, the photodiode is designed and implanted with gradient doping profile with higher dose near semiconductor material surface and gradually decreases as implant depth in semiconductor material increases to obtain desired full well capacitance, and also lower potential level to facilitate photogenerated charges from deepest region of photodiode to move toward semiconductor material surface and transfer to floating diffusion region through channel region of respective transfer gate. However, unevenly doping distribution tend to lead to the formation energy traps with higher dosage resulting in higher pining voltage Vpin causing deeper energy trap to be formed in the charge travel path within photodiode region trapping charges, thereby lead to insufficient transfer.

Accordingly, with through semiconductor vertical gate or through semiconductor fin structure extend through photodiode region 420 of the photodiode 120, the photodiode region 420 can be formed with a substantially uniform doping profile (e.g., implant with even dose providing evenly distribute dopant concentration) throughout a formed depth of the photodiode region 420 of photodiode, yielding low level of pinning voltage Vpin associated with photodiode 120. As such, deep energy trap associated with high pinning voltage Vpin can be removed within photodiode region 420 of photodiode 120 and prevent insufficient charge transfer, at same time maintain the full well capacity of photodiode 120 as no need to tune dosage of implanted photodiode region 420 or reduce volume of photodiode region 420 to compensate for low pinning voltage Vpin.

Figure 7:
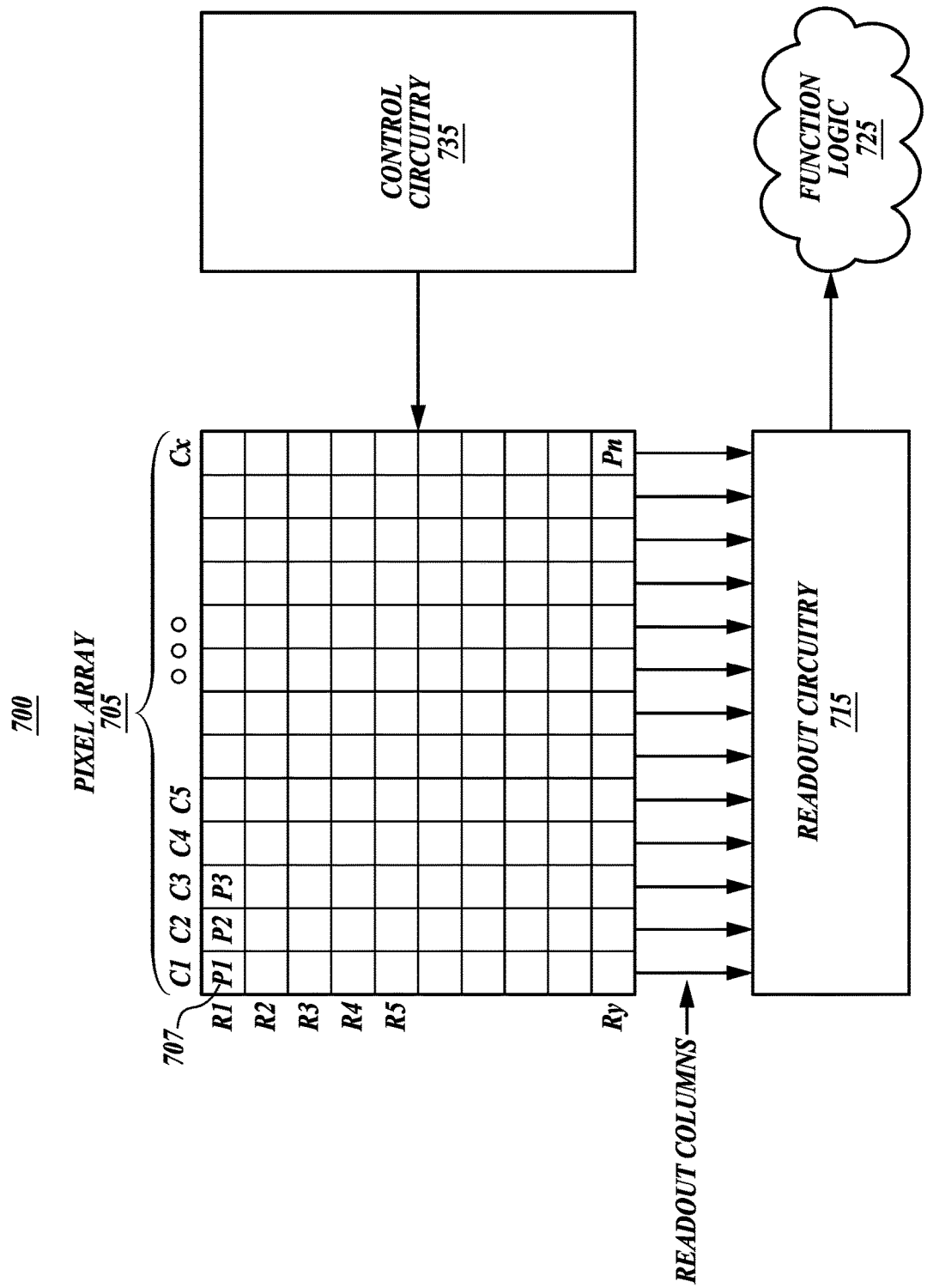
FIG. 7 is a diagram illustrating one example of an imaging system with a pixel array in accordance with the teachings of the present invention.

FIG. 7 is a diagram illustrating one example of an imaging system 700 with a pixel array 705 in accordance with the teachings of the present invention. As shown in the depicted example, an imaging system 700 includes a pixel array 705 coupled to a control circuitry 735 and a readout circuitry 715, which is coupled to a function logic 725.

Pixel array 705 is a two-dimensional ("2D") array of pixels 707 (e.g., pixels P1, P2 . . . , Pn). In one embodiment, each pixel is a complementary metal-oxide-semiconductor ("CMOS") imaging pixel. It is noted that each pixel 707 in the pixel array 705 of FIG. 7 may include one or more photodiodes, transfer gates, and floating diffusion regions as discussed in the embodiments above in FIGS. 1-5, and that similarly named and numbered elements referenced below are coupled and function similar to as described above. Pixel array 705 may be implemented as either a front side illuminated image sensor array, or a backside illuminated image sensor array. In one embodiment, pixel array 705 includes a pixel array, such as the pixels depicted in FIG. 1. The pixel array 705 includes a plurality of pixels 707. As illustrated, each pixel 707 is arranged into a row (e.g., rows R1 to Ry) and a column (e.g., column Cl to Cx) to acquire image data of a person, place, or object, which can then be used to render a 2D image of the person, place, or object.

In one embodiment, after each pixel 707 has acquired its image data or image charge, the image data is readout by readout circuitry 715 and transferred to function logic 725. Readout circuitry 715 may include amplification circuitry, e.g., a differential amplifier circuitry, analog-to-digital ("ADC") conversion circuitry, or otherwise.

Function logic 725 may include logic and memory for storing the image data or even manipulating the image data by applying post image effects (e.g., crop, rotate, remove red eye, adjust brightness, adjust contrast, or otherwise). In one example, the readout circuitry 715 may readout a row of image data at a time along readout column lines (illustrated) or may readout the image data using a variety of other techniques (not illustrated), such as a serial readout or a full parallel readout of all pixels simultaneously.

Control circuitry 735 is coupled to pixel array 705. Control circuitry 735 may include logic and memory for controlling operational characteristic of pixel array 705. For example, control circuitry 735 may generate a shutter signal for controlling image acquisition. In one embodiment, the shutter signal is a global shutter signal for simultaneously enabling all pixels 707 within pixel array 705 to simultaneously capture their respective image data during a single acquisition window. In an alternative embodiment, the shutter signal is a rolling shutter signal whereby each row, column, or group of pixels is sequentially enabled during consecutive acquisition windows.

The control circuitry 735 may generate transfer signals and transmit the transfer signals to the transfer gates 130 depicted in FIG. 1 in order to create the channel for the charge to pass from the respective photodiodes 120 to the coupled floating diffusion region 140. The photogenerated charges received at the floating diffusion region 140 may be read out by the readout circuitry 715. In one example, the charge received at the floating diffusion region 140 may be amplified or buffered by an amplifier or other component which has an output which is read by the readout circuitry 715. Accordingly, the control circuitry 705 and readout circuitry 715 function together as a controller to transmit the transfer signal to the transfer gate and readout the transferred charge.

As can be appreciated by the above description of the image sensor with a substantially uniform doping profile throughout a depth of the photodiode and fin structures in the transfer gate improved performance of the device in both speed and accuracy of reading out charges generated by the photodiode.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example dimensions, voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A device, comprising:
    a photodiode disposed in a semiconductor material, wherein the photodiode is coupled to generate charges in response to incident light, wherein the photodiode has a photodiode region of a substantially uniform doping profile throughout a depth of the photodiode in the semiconductor material;
    a floating diffusion region disposed in the semiconductor material;
    a transfer gate disposed between the photodiode and the floating diffusion region, wherein the transfer gate includes a plurality of fin structures; and
    a channel region associated with the transfer gate, disposed in the semiconductor material proximate to the transfer gate, wherein the transfer gate is coupled to transfer the charges from the photodiode to the floating diffusion region through the channel region in response to a transfer signal coupled to be received by the transfer gate.

2. The device of claim 1, wherein the transfer gate includes a cap portion disposed proximate to a front surface of the semiconductor material, wherein the plurality of fin structures extend from the cap portion into and through the semiconductor material, wherein a portion of the charges is coupled to be transferred from the photodiode to the floating diffusion region through the channel region disposed along the plurality of fin structures and not along the cap portion when the transfer gate receives a biasing voltage and conducts.

3. The device of claim 2, further comprising an isolation layer disposed underneath the photodiode region of the photodiode.

4. The device of claim 2, wherein the portion of the charges coupled to be transferred from the photodiode to the floating diffusion region through the channel region along the plurality of fin structures is a majority of the charges transferred through the channel region.

5. The device of claim 1 wherein the plurality of fin structures extend from a cap portion of the transfer gate into and extend through the photodiode region of the photodiode; wherein a passivation layer is disposed between each fin structure and the photodiode region of the photodiode.

6. The device of claim 5, wherein the plurality of fin structures extend from the cap portion of the transfer gate disposed proximate to a front surface of the semiconductor material to a backside surface of the semiconductor material, wherein the channel region is disposed between the plurality of fin structures.

7. The device of claim 6, wherein the channel region extends into the photodiode.

8. The device of claim 1, wherein a junction depth of the floating diffusion region is substantially the same as a junction depth of the photodiode in the semiconductor material.

9. The device of claim 1, wherein a depth of the plurality of fin structures in the semiconductor material with respect to the front surface of the semiconductor material is greater than the depth of the photodiode region of the photodiode in the semiconductor material.

10. The device of claim 1, further comprising:
a plurality of photodiodes disposed in the semiconductor material, wherein the photodiode is one of the plurality of photodiodes;
a plurality of transfer gates disposed in the semiconductor material, wherein the transfer gate is one of the plurality of transfer gates;
a plurality of channel regions in the semiconductor material, wherein the channel region is one of the plurality of channel regions, wherein each one of the plurality of transfer gates is coupled to transfer charge from a respective one of the plurality of photodiodes to the floating diffusion region through a respective one of the plurality of channel regions in response to a respective one of a plurality of transfer signals, wherein the transfer signal is one of the plurality of transfer signals.

11. An imaging system, comprising:
a pixel array including a plurality of pixels arranged into a plurality of rows and a plurality of columns, wherein each one of the pixels includes:
a photodiode disposed in a semiconductor material, wherein the photodiode is coupled to generate charges in response to incident light, wherein the photodiode has a photodiode region of a substantially uniform doping profile throughout a depth of the photodiode in the semiconductor material;
a floating diffusion region disposed in the semiconductor material;
a transfer gate disposed between the photodiode and the floating diffusion region, wherein the transfer gate includes a plurality of fin structures;
a channel region in the semiconductor material proximate to the transfer gate, wherein the transfer gate is coupled to transfer the charges from the photodiode to the floating diffusion region through the channel region in response to a transfer signal coupled to be received by the transfer gate;
a control circuitry coupled to the pixel array to control operation of the pixel array; and
a readout circuitry coupled to the pixel array to read out image data from the plurality of pixels.

12. The imaging system of claim 11, further comprising function logic coupled to the readout circuitry to store the image data from each one of the plurality of pixels.

13. The imaging system of claim 11, wherein the transfer gate includes a cap portion disposed proximate to a front surface of the semiconductor material, wherein the plurality of fin structures extend from the cap portion into and through the semiconductor material, wherein a portion of the charge is coupled to be transferred from the photodiode to the floating diffusion region through the channel region disposed along the plurality of fin structures and not along the cap portion.

14. The imaging system of claim 13, wherein each one of the plurality of pixels further comprises an isolation layer underneath the photodiode region of the photodiode.

15. The imaging system of claim 14, wherein the portion of the charges coupled to be transferred from the photodiode to the floating diffusion region through the channel region along the plurality of fin structures is a majority of the charges transferred through the channel region.

16. The imaging system of claim 11 wherein the plurality of fin structures extend from a cap portion into and extend through the photodiode region of photodiode; wherein a passivation layer is disposed between each fin structure and the photodiode region of the photodiode.

17. The imaging system of claim 16, wherein the plurality of fin structures extend from the cap portion of the transfer gate disposed proximate to a front surface of the semiconductor material to a backside surface of the semiconductor material, wherein the channel region is disposed between the plurality of fin structures.

18. The imaging system of claim 17, wherein the channel region extends into and extend through the photodiode region of the photodiode.

19. The imaging system of claim 11, wherein a junction depth of the floating diffusion region from the front surface of the semiconductor material is substantially the same as a junction depth of the photodiode in the semiconductor material.

20. The imaging system of claim 11, wherein a depth of the plurality of fin structures in the semiconductor material is greater than the depth of the photodiode region of the photodiode in the semiconductor material.

21. The imaging system of claim 11 wherein each one of the plurality of pixels further comprises:
a plurality of photodiodes disposed in the semiconductor material, wherein the photodiode is one of the plurality of photodiodes;
a plurality of transfer gates disposed in the semiconductor material, wherein the transfer gate is one of the plurality of transfer gates;
a plurality of channel regions in the semiconductor material, wherein the channel region is one of the plurality of channel regions, wherein each one of the plurality of transfer gates is coupled to transfer charge from a respective one of the plurality of photodiodes to the floating diffusion region through a respective one of the plurality of channel regions in response to a respective one of a plurality of transfer signals, wherein the transfer signal is one of the plurality of transfer signals, wherein the control circuitry is coupled to transmit the plurality of transfer signals.

\* \* \* \* \*